United States Patent
Lamb et al.

(10) Patent No.: US 9,121,892 B2
(45) Date of Patent: Sep. 1, 2015

(54) SEMICONDUCTOR CIRCUIT AND METHODOLOGY FOR IN-SYSTEM SCAN TESTING

(75) Inventors: David Lamb, Sao Paolo (BR); Kendrick Owen Daniel Franzen, Copenhagen (DK); David Hossack, Somerville, MA (US)

(73) Assignee: ANALOG DEVICES GLOBAL, Hamilton (BM)

( * ) Notice: Subject to any disclaimer, the term of this patent is extended or adjusted under 35 U.S.C. 154(b) by 171 days.

(21) Appl. No.: 13/584,630

(22) Filed: Aug. 13, 2012

(65) Prior Publication Data

US 2014/0047293 A1   Feb. 13, 2014

(51) Int. Cl.
- G01R 31/28 (2006.01)
- G01R 31/27 (2006.01)
- G01R 31/3185 (2006.01)

(52) U.S. Cl.
CPC ........ *G01R 31/27* (2013.01); *G01R 31/318555* (2013.01)

(58) Field of Classification Search
None
See application file for complete search history.

(56) References Cited

U.S. PATENT DOCUMENTS

| | | | |
|---|---|---|---|
| 5,951,705 A | 9/1999 | Arkin et al. | |
| 6,324,662 B1 * | 11/2001 | Haroun et al. | 714/724 |
| 6,357,026 B1 * | 3/2002 | Hoang et al. | 714/727 |
| 6,430,718 B1 | 8/2002 | Nayak | |
| 6,536,008 B1 * | 3/2003 | Nadeau-Dostie et al. | 714/726 |
| 6,640,322 B1 * | 10/2003 | Schulz | 714/724 |
| 6,785,854 B1 | 8/2004 | Jaramillo et al. | |
| 6,961,871 B2 * | 11/2005 | Danialy et al. | 714/30 |
| 7,237,161 B2 | 6/2007 | Volz | |
| 7,533,315 B2 * | 5/2009 | Han et al. | 714/733 |
| 7,900,086 B2 | 3/2011 | Datta et al. | |
| 8,533,545 B2 * | 9/2013 | Goyal et al. | 714/726 |
| 8,719,649 B2 * | 5/2014 | Portolan et al. | 714/726 |
| 8,775,884 B2 * | 7/2014 | Portolan et al. | 714/729 |
| 2004/0148553 A1 * | 7/2004 | Nalbantis | 714/726 |
| 2005/0262409 A1 * | 11/2005 | Wang et al. | 714/738 |
| 2007/0011535 A1 * | 1/2007 | Anzou et al. | 714/733 |
| 2011/0264971 A1 | 10/2011 | Bahl et al. | |

* cited by examiner

*Primary Examiner* — Daniel McMahon
(74) *Attorney, Agent, or Firm* — Kenyon & Kenyon, LLP

(57) ABSTRACT

A semiconductor circuit comprises a digital circuit portion, which in turn comprises a combinatorial logic block. The semiconductor circuit comprises a scan chain for loading and applying a predefined digital test pattern to inputs of the combinatorial logic block. A bi-directional communication port is adapted for writing incoming data to an address space of the digital circuit portion such as register addresses and/or memory addresses. Scan control hardware comprises a plurality of individually addressable scan control registers which are mapped to the address space of the bi-directional communication port. A method of testing the digital circuit portion through the scan chain involves writing bit values to inputs of the individually addressable scan control registers and reading bit values from at least one output of an individually addressable scan control register.

20 Claims, 5 Drawing Sheets

SEMICONDUCTOR CIRCUIT AND METHODOLOGY FOR IN-SYSTEM SCAN TESTING

BACKGROUND OF THE INVENTION

The invention provides valuable improvements over existing ATPG (Automated Test Pattern Generation) test methodologies, on-chip scan control hardware and ATE equipment in connection with testing of digital semiconductor devices or integrated circuits (ICs). Existing ATPG test methodologies are widely used in the semiconductor industry for digital IC testing during manufacturing such that defective semiconductor devices can be identified and discarded during production test. The existing ATPG test methodologies can also be used for diagnostic purposes to identify a particular portion of digital logic/gates that often fails such that the error-prone digital logic portion may be redesigned if the yield figures are unacceptable. Existing ATPG test methodologies require the use of numerous externally accessible pins or pads of the semiconductor device to be tested. These external pins are used during production test of the semiconductor device to apply digital test patterns to the digital logic to be tested through on-chip scan-chain logic. The scan chain logic is coupled to inputs and outputs of the digital logic block of the semiconductor device or circuit. External scan pads or pins are also required for read-out of digital response patterns to the applied digital test pattern(s) and to control of an operational mode of the semiconductor device, i.e. scan mode active or normal mode operation. Furthermore, since numerous separate scan-chains coupled to different logic blocks of the digital logic are utilized for typical digital semiconductor circuits, the number of external pins that must be allocated for ATPG testing becomes large. The latter fact mandates that each of the external pins allocated for ATPG testing purposes have multiple functions such that these pins can function as ordinary data I/O pins or pads during the normal operation mode (i.e. not in scan-mode) of the semiconductor device.

Hence, the large number of external pins mandates the use of ATE equipment for ATPG testing that can physically access (through a customized probe tool) and electrically control logic states of all external/package pins of the semiconductor device. This feature limits the application of ATPG test methodologies to production test at the wafer level before the semiconductor device is packaged and shipped to the customer. Once the semiconductor device is mounted on the customer's printed circuit board (PCB), the external pins which possess ATPG functionality become electrically coupled to surrounding board circuitry which eliminates the possibility of controlling logic states and voltages on the external ATPG pins.

After the semiconductor device is attached to the customer's circuit board the board is normally tested at the customer's manufacturing facility. Hence if the semiconductor device fails, or is suspected to be failing, during board level testing the semiconductor device must be removed from the customer's board when failure analysis is required. This is a time-consuming and error-prone operation due to the number of pins, small pin pitch and miniscule dimensions of contemporary semiconductor circuits. The failed semiconductor circuit may consequently be damaged by the PCB removal operation itself. This can often make it impossible to properly diagnose or analyze the suspected or failed semiconductor device. Unfortunately, the detection of failures during the initial board level testing is important in virtually all types of applications despite the prior ATPG based production level testing being applied to semiconductor device as explained above. This is due to the desire to eliminate 'early life failures' of the semiconductor device which errors occur after shipment of the semiconductor device, but before the customer releases the circuit board. Furthermore, the detection of "early life failures" becomes increasingly important in safety-critical applications such as automotive, medical or aerospace.

Consequently, it would be highly beneficial to devise testing methodologies for semiconductor devices, and integral or on-chip scan chain hardware, which facilitate thorough testing and diagnosing of failing semiconductor devices while mounted in the customer's PCB. This feature allows the customer to test the failing semiconductor device at his factory premises. Furthermore, the manufacturer of the semiconductor device is capable of testing returned semiconductor devices while these remain board mounted, thereby eliminating the time-consuming and risky process of removing the device.

It would additionally be advantageous to perform the testing of the failing semiconductor device with existing digital test patterns and reuse of existing on-chip scan chain hardware developed for existing ATPG testing purposes during semiconductor manufacturing. These features will ensure high and predictable scan test coverage of the digital logic circuitry under test despite the semiconductor device being mounted in the customer's printed circuit board.

The present invention addresses the above-mentioned problems and challenges associated with existing ATPG test methodologies and on-chip scan control logic or hardware to provide the outlined desirable features and solutions together with numerous others as explained in further detail below.

SUMMARY OF THE INVENTION

A first aspect of invention relates to a semiconductor circuit comprising a digital circuit portion, which comprises a combinatorial logic block. The semiconductor circuit further comprises a scan chain for loading and applying a predefined digital test pattern to inputs of the combinatorial logic block. The scan chain is configured to read and transmit a digital response pattern produced by outputs of the combinatorial logic block in response to the predefined digital test pattern. A bi-directional communication port is adapted for writing incoming data to an address space of the digital circuit portion, the address space comprising register addresses or memory addresses. Scan control hardware is configured to selectively place the semiconductor circuit a scan mode or an operational mode and comprises a plurality of scan interface nodes and a plurality of individually addressable scan control registers. A first scan interface node is coupled to the scan chain for selectively enabling and disabling the scan chain. A second scan interface node is coupled to the scan chain for loading the predefined digital test pattern. A third scan interface node is coupled to the scan chain for clocking the scan chain. A fourth scan interface node is coupled to an output of the scan chain for temporarily storing and outputting bit values of the digital response pattern. A first, a second, a third and a fourth individually addressable scan control register are operatively coupled to the first, second, third and fourth scan interface nodes, respectively. The first, second, third and fourth individually addressable scan control registers are mapped to the address space of the bi-directional communication port.

The bi-directional communication port is preferably also adapted to read data such as bit values or logic states from the register addresses and/or memory addresses mapped to its address space. The mapping of the above listed scan control registers to the address space of the bi-directional communication port in accordance with the invention provides numerous benefits. The address space mapping allows the selective writing of bit values to the inputs of the first, second and third scan control registers or any further address space mapped scan control registers. Likewise, the address space mapping of the scan control registers allows selective reading of bit values or logic states of outputs of the fourth scan control register or any other address space mapped scan control register(s). Accordingly, the scan chain can be enabled or disabled and bit values of the predefined digital test pattern loaded into the scan chain while it is enabled by appropriately addressed write commands from the bi-directional communication port. Likewise, the scan chain can be clocked by a clock signal transmitted from the bi-directional communication port by addressing and sequentially asserting and de-asserting an input of the third individually addressable scan control register. Furthermore, the address space mapping also allows selective reading of bit values or states of outputs of the scan control registers such as output bit values of the digital response pattern provided by the fourth individually addressable scan control register. These output bit values of the digital response pattern can be read from or through the bi-directional communication port by sequentially addressing the fourth individually addressable scan control register and reading the outputted bit values. Consequently, ATPG test methodologies, including the application of the digital test pattern and read-out of digital response patterns, can be applied to the combinatorial logic block of the semiconductor circuit through the bi-directional communication port by sequentially issuing appropriate read and write commands to the individually addressable scan control registers. This can be carried out without using any of the traditional externally accessible scan control pins of the semiconductor circuit and without using the associated ATE equipment interfacing to these external scan control pins. Instead, scan test commands and the predetermined digital test pattern(s) can be generated by, and transmitted from, an external microprocessor, through the bi-directional communication port to control the operation of the on-chip scan control hardware. The external microprocessor may in some applications be arranged on a customer's printed circuit board (PCB) together with the present semiconductor device such that in-system scan testing is enabled by a data communication interface interconnecting the external microprocessor and the semiconductor circuit. The combinatorial logic block preferably comprises at least a portion of core logic of the semiconductor circuit since the latter is inaccessible to traditional JTAG based boundary scan ports and methodologies. Hence, the scan control hardware in accordance with the present invention can make the semiconductor circuit completely insensitive to logic states of all other external package pins than the bi-directional communication port, in particular externally accessible pads with ATPG functionality.

The skilled person will appreciate that the digital circuit portion of the semiconductor circuit may comprise one or more additional combinatorial logic blocks that each is coupled to a dedicated scan chain and associated scan control hardware in a manner which corresponds to the above. Each of these additional combinatorial logic blocks preferably comprises a pair of separate individually addressable scan control registers for loading the digital test pattern assigned to the scan chain in question and outputting the digital response pattern. The existing output of the first scan control flip-flop, for enabling and disabling the scan state, and the output of the existing third scan control flip-flop, for supplying the scan clock signal to the scan chain, are preferably shared with the one or more additional scan chains. The amount of additional digital logic required to enable the present scan testing through the bi-directional communication port is thereby minimized.

Consequently, the present invention allows the customer or manufacturer of the PCB to perform a comprehensive scan test of the entire digital circuit portion of a failing or suspected semiconductor device while mounted on the customer PCB by executing an appropriate scan test program or application on the external microprocessor as described in further detail below.

The coupling of the individually addressable scan control registers to respective ones of the first, second, third and fourth scan interface nodes furthermore facilitates reuse of traditional scan chain logic designs and accompanying CAD based design methodologies. These scan interface nodes, which traditionally are driven from the previously discussed externally accessible pins/pads with ATPG functionality, provide a convenient and advantageous interface to the present collection of individually addressable scan control registers. This means that the widely used and sophisticated existing methods of scan chain design, scan chain insertion and test pattern generation supported by existing CAD based design tools can be re-used in connection with the design of the present scan control hardware. The existing CAD based design tools can simply be supplemented or upgraded with a specific application or software utility related to the design and insertion of the present scan control hardware including the individually addressable scan control registers.

Moreover, the present semiconductor circuit may in accordance with a preferred embodiment include a set of the above-discussed externally accessible ATPG pads for ATE equipment interfacing such that the programming port based scan testing of the semiconductor circuit is supplemented with an additional source of scan testing. This embodiment provides additional flexibility in the scan testing of the semiconductor device by allowing the traditional ATE equipment to be utilized for scan testing during manufacturing, or at any other instant where the semiconductor device is unconnected to the PCB. The latter option will typically reduce the test time of the scan testing because the digital test pattern and response pattern(s) can be applied at a faster clock/data rate when the scan chain logic is driven directly from the externally accessible ATPG pads and ATE equipment. According to this embodiment, the scan control hardware comprises the above-mentioned set of externally accessible scan input pads. A set of scan select multiplexers is inserted between the scan interface nodes and the respective outputs of the first, second and third scan control registers such that first inputs of the scan select multiplexers are coupled to respective outputs of the scan control registers. Second inputs of the scan select multiplexers are coupled to respective ones of the set of externally accessible scan input pads. Each of the scan select multiplexers is controlled by a scan configuration signal provided by an individually addressable scan control select register. The scan chain is thereby selectively drivable from one of the set of externally accessible scan input pads and the scan control registers. The scan select multiplexers are accordingly used to control whether the scan chain is driven from the set of externally accessible scan input pads or the individually addressable scan control registers. Moreover, via the individually addressable scan control register the selection between these scan test configuration modes can be carried out in a convenient manner by issuing an appropriately addressed command from the bi-directional port to set the logic state of the scan control select register. The output of the scan chain may be applied in parallel to an externally accessible scan output pad and the above-discussed fourth individually addressable scan control register without any need for a scan select multiplexer.

In a preferred embodiment, the scan control hardware comprises a fifth individually addressable scan control register for receipt and temporary storage of bit values of a predetermined expect or reference bit pattern transmitted from the bi-directional communication port. A data comparator circuit is provided on the digital circuit portion and a first input of the data comparator circuit is coupled to the output of the scan chain. A second input of the data comparator circuit is coupled to an output of the fifth individually addressable scan control register. A sixth individually addressable scan control register is coupled to an output of the data comparator circuit for receipt and storage of a result of the comparison. This embodiment supports a simple and highly useful pass/fail mode evaluation of the combinatorial logic block of the semiconductor circuit in connection with the scan testing. This is accomplished, as described in further detail below in connection with FIG. 4, because the validation of the validity of the generated digital response pattern from the scan chain output can be checked on-chip by utilizing the additional fifth and sixth individually addressable scan control registers, the data comparator and the predetermined expect or reference bit pattern circuit.

According to a preferred embodiment, the sixth individually addressable scan control register comprises error flag circuitry configured to, at a first detection of a data error at the output of the data comparator circuit, assert an error flag and retain the asserted state throughout residual bit comparisons between the bit values of the expect bit pattern and the corresponding bit values of the digital response pattern. Since the asserted state of the error flag is retained throughout residual bit comparisons between the expect bit pattern and the digital response pattern the validity can be verified by a single read operation of the error flag instead of performing a time-consuming reading of each output bit value of the digital response pattern and subsequently comparison of the output bit value with the corresponding bit value of the expect bit pattern. Furthermore, since the asserted state of the error flag may be retained throughout the excitation with a complete collection of predefined digital test patterns and their corresponding expect bit patterns, the error flag may indicate the outcome of the entire scan test of the scan chain in question in a highly convenient manner for example as a simple pass or fail indication.

The scan chain may be of conventional design and comprise a plurality of cascaded flip-flops having respective outputs coupled to the inputs of the combinatorial logic block. A plurality of multiplexers each has a first input coupled to an output of the combinatorial logic block and a second input coupled to respective outputs of the plurality of cascaded flip-flops. Outputs of the plurality of multiplexers are coupled to respective data inputs of the plurality of cascaded flip-flops. A select input of each multiplexer is coupled to the first scan interface node and a clock input of each of the cascaded flip-flops is coupled to the third scan interface node. The skilled person will appreciate that other suitable types of memory elements could replace the flip-flops to temporality store input and output values of the digital test patterns and digital response patterns, respectively, during scan testing.

In yet another embodiment, the scan control hardware further comprises a seventh scan interface node coupled to the scan chain for resetting the scan chain. A seventh individually addressable scan control register is coupled to the seventh scan interface node. A seventh scan control flip-flop has an output coupled to the seventh interface node of the scan chain.

The seventh interface node may be coupled to respective reset inputs of memory elements or data registers of the scan chain. These memory elements may comprise respective flip-flops such as D flip-flops or RS flip flops. Hence, the data registers of the scan chain may be reset by the seventh scan control flip-flop by addressing and writing an appropriate logic state to the input thereof through the bi-directional communication port. The seventh interface node may for example be toggled one time before the predefined digital test pattern is loaded into the scan chain to set the scan chain in a known logic state.

According to another preferred embodiment of the semiconductor circuit, the scan control hardware comprises a clock multiplier that can drive the third scan interface node, which is coupled to the clock line/signal of the scan chain, with a fast or multiplied clock signal. The purpose of the fast clock signal is to allow the combinatorial logic block(s) of the integrated circuit to be tested at full operational speed, i.e. to perform a so-called 'transition at-speed' test and validation of the combinatorial logic block. Testing at the full operational speed through the bi-directional communication port may not be possible because of speed/data rate limitations of many popular types of industry standard communication ports. The speed limitation may limit the frequency of the clock signal that can be applied to the scan chain to a value below the intended or specified maximum clock frequency of the digital logic portion of the integrated circuit. According to this embodiment, the scan control hardware comprises a clock multiplier having a clock input coupled to a system clock signal of the semiconductor circuit and configured to produce a multiplied clock signal with a higher frequency than the system clock. The scan control hardware additionally comprises a clock multiplexer coupled to the output of the third scan control register and to the multiplied clock signal to selectively transmit, to the third scan interface node, one of the output of the third scan control register and the multiplied clock signal. The clock multiplier may comprise a PLL that multiplies the system clock signal with a certain integer or non-integer factor larger than one to provide the multiplied clock signal with a higher frequency than the system clock signal. The system clock signal may be generated by an external crystal based clock generator mounted on the customer's PCB and conveyed to the clock input via an externally accessible pad or terminal of the semiconductor circuit to allow in-circuit testing and validation at-speed. Preferably, the operation of the clock select multiplexer is controlled by a separate individually addressable scan control flip-flop mapped to the address space of the bi-directional communication port such that selection of the source of the clock signal for the scan chain can be controlled through the bi-directional communication port.

The skilled person will understand the above-mentioned individually addressable scan control registers may comprise any suitable type of digital memory elements or digital data registers such as flip-flops, e.g. SR flip-flops and D-flip-flops.

The bi-directional communication port preferably comprises an existing communication port or interface of the integrated circuit such that the amount of additional hardware required for implementing the write and read functionality to/from the individually addressable scan control registers becomes minimal. In practice, only a very small amount of digital logic is required to implement the mapping of the individually addressable scan control registers to respective unique addresses of the address space of the bi-directional communication port. The majority of the address space of the bi-directional communication port will typically be mapped to memory and registers of the integrated circuit. The bi-directional communication port preferably comprises as an industry standard type of wired data communication interface such as I²C, SPI, JTAG etc. The JTAG interface exists on many integrated circuits for boundary scan testing which allows checking of the interconnection between several integrated circuits mounted on a common circuit board. However, the traditional JTAG interface lacks amongst other features the capability to address and actuate scan chain logic connected to a core logic portion of the integrated circuit.

A second aspect of the invention relates to an electronic circuit board assembly comprising a printed circuit board comprising a plurality of wire traces. A semiconductor circuit according to any of the above-described embodiments thereof is attached or soldered to the printed circuit board at a first position such that the bi-directional communication port is coupled to a wired data bus arranged on the printed circuit board. A microprocessor is attached to the printed circuit board at a second position and comprises a data communication interface electrically coupled to the bi-directional communication port through the wired data bus. The electronic circuit board assembly further comprises a non-volatile memory operatively coupled to the microprocessor. The non-volatile memory is configured to store: executable commands for addressing and manipulating the scan control hardware, the predefined digital test pattern(s) and the corresponding expect bit pattern(s).

The above-discussed scan test program or application adapted for performing the in-system scan testing of the present semiconductor circuit comprises the executable commands for addressing and manipulating the scan control hardware, the predefined digital test pattern(s) and the expect bit pattern(s). The non-volatile memory device may be integrally formed, i.e. on-chip, with the microprocessor or provided as a separate memory device mounted to the customer PCB and coupled to the microprocessor through a suitable data interface as previously mentioned.

The manufacturer of the semiconductor circuit may provide the scan test program or application to the customers which manufactures the present electronic circuit board assembly. The scan test program or application may in one embodiment be adapted to perform the above-discussed simple and useful pass/fail mode evaluation of the combinatorial logic block of the semiconductor circuit if the scan test hardware comprises the above-discussed digital logic circuitry for the purpose. In another embodiment, the scan test program or application may be adapted to perform a sequential reading of the bit values of the digital response pattern(s) conveyed through the fourth scan register. The digital response pattern(s) can then be compared to the corresponding expect bit pattern(s) by the scan test program or application executed on the external microprocessor as discussed in further detail below in connection with the disclosed method of testing the digital circuit portion of the semiconductor circuit. Both embodiments of the scan test program or application allow the customer to test a failing semiconductor device, or suspected failing device, at his/her factory premises such that 'early life failures' of the semiconductor device can be detected before shipment or field application. However, the latter embodiment has the additional advantage that the exact bits of a particular predefined digital test pattern that failed the scan test can be identified and used by the semiconductor manufacturer to identify error-prone portions of logic of the semiconductor circuit.

A third aspect of the invention relates to a method of testing a digital circuit portion of a semiconductor circuit through a scan chain; the method comprising steps of:

a) placing the semiconductor circuit in scan enable mode by addressing and asserting a logic state of a first scan control register from a bi-directional communication port of the semiconductor circuit, b) addressing and writing a bit value of a predefined digital test pattern from the bi-directional communication port to a second scan control register coupled to an input of the scan chain, c) addressing a fourth scan control register coupled to an output of the scan chain from the bi-directional communication port and temporarily storing a bit value of a digital response pattern at an output of the fourth scan control register, d) toggling a scan clock signal coupled to the scan chain through a third scan control register from the bi-directional communication port, e) repeating steps b), c) and d) a predetermined number of times, N, to sequentially shift the bit values written to the second scan control register into the scan chain for loading of the predefined digital test pattern, f) placing the digital circuit portion in functional mode by addressing and de-asserting the logic state of the first scan control register from the bi-directional communication port of the semiconductor circuit, g) toggling the scan clock signal a single time through the third scan control register from the bi-directional communication port to apply the predefined digital test pattern to inputs of a combinatorial logic block of the digital circuit portion, h) writing the digital response pattern produced by outputs of the combinatorial logic block in response to the predefined digital test pattern to the scan chain, i) placing the semiconductor circuit in the scan enable mode by addressing and asserting the logic state of the first scan control register from the bi-directional communication port, j) repeating steps b), c) and d) to shift out and temporarily store bit values of the digital response pattern at the output of the fourth scan control register. As mentioned above, the validity of the digital response pattern may be checked by at least two different methodologies. One methodology comprises further steps of:

k) subsequent to step c) sequentially reading the bit values of the digital response pattern from the bi-directional communication port by addressing and reading the output of the fourth scan control register, l) comparing read bit values of the digital response pattern with corresponding bit values of a predetermined expect or reference bit pattern.

The test program or application running on the external microprocessor may be adapted to perform the sequential reading of the bit values of the digital response pattern through the bi-directional communication port by an appropriate set of executable microprocessor instructions or commands. Accordingly, the method may comprise a further step of:

t) transmitting sequential read commands from an external microprocessor through a data communication interface coupled to the bi-directional communication port of the semiconductor circuit for executing step k). Likewise, the test program or application may perform the comparison between read bit values of the digital response pattern and the corresponding bit values of the predetermined expect or reference bit pattern under step l). In the latter embodiment, the test program itself is accordingly adapted to perform the verification of the digital response pattern. The digital response pattern(s) may have been read into data memory of the external microprocessor from a predefined address space of the non-volatile memory in connection with initialization of the present scan chain based testing methodology. The predetermined expect or reference bit pattern(s) may likewise have been read into data memory from another predefined address space of the non-volatile memory in connection with initialization of the scan chain based testing methodology In another embodiment, the validity of the digital response pattern is checked on-chip by the above-discussed additional scan test hardware enabling the pass/fail mode evaluation of the combinatorial logic block. In the latter embodiment, the test methodology further comprises the steps of:

m) subsequent to step c) addressing and writing a bit value of a predetermined expect or reference bit pattern to a fifth scan control register from the bi-directional communication port, n) applying the stored bit value of digital response pattern at the fourth scan control register and the bit value of the predetermined expect bit pattern to first and second inputs, respectively, of a data comparator circuit of the scan control hardware, o) comparing the first and second inputs of the data comparator circuit and indicating a result by setting a logic state of a sixth individually addressable scan control register. The test application is preferably configured to perform a sequential addressing and writing of the bit values of the predetermined expect or reference bit pattern to the fifth scan control register through the bi-directional communication port by a suitably configured set of executable microprocessor commands. The test application may furthermore be configured to read the logic state of a sixth individually addressable scan control register during the test to determine whether the semiconductor circuit failed or passed the scan test. However, to reduce the required number of read operations by the test program, the methodology may include the application of a so-called sticky error flag on the scan control hardware. According to this embodiment, the test methodology comprises a further step of:

p) asserting an error flag at the first detection of a pattern error during the data comparison in step o) and retaining the asserted state of the error flag throughout residual bit comparisons between the expect bit pattern and the digital response pattern. The outcome of the scan testing can accordingly be determined by the external microprocessor by a performing a further step of:

q) reading the state of the error flag subsequent to step p) from the external microprocessor through the bi-directional communication port so as determine whether the digital response pattern matched the predetermined expect or reference bit pattern. An asserted state of the sticky error flag is preferably maintained even if the scan testing comprises the plurality of predefined digital test patterns and their corresponding expect bit patterns such that the error flag indicates the outcome of the scan testing of all predefined digital test patterns.

The external microprocessor is preferably adapted to perform the reading of the state of the error flag in connection with step q) by:

t) transmitting sequential read commands through a data communication interface coupled to the bi-directional communication port of the semiconductor circuit. The data communication interface preferably comprises a wired data bus and a data interface compatible with the selected type of bi-directional communication port of the semiconductor circuit. The external microprocessor and semiconductor circuit may for example comprise respective I²C data interfaces or ports or respective SPI, USB or any other industry standard type of serial or parallel bi-directional data communication interface.

In one embodiment, the test methodology comprises a further step of:

r) subsequent to step a) addressing and toggling, from the bi-directional communication port, an output of a seventh individually addressable scan control register coupled to a reset interface node of the scan chain as described above.

The skilled person will appreciate that the scan test program or application may comprise a plurality of digital test patterns and corresponding expect bit patterns since the semiconductor circuit may comprise a plurality of separate scan chains and each scan chain furthermore typically will be subjected to a plurality of dedicated test patterns to verify the functionality of the combinatorial logic block coupled thereto. Therefore, the present methodology may comprise a further step of:

s) repeating steps b), c), d), e), f), g), h) and i) a predetermined number of times, M−1, for applying an additional number of M−1 predefined digital test patterns and reading M corresponding digital response patterns; M being a positive integer >2.

M may have a value between 5 and 20 depending on the desired or target fault coverage of the combinatorial logic block on a particular semiconductor circuit design. Each of the digital test patterns may have a size between 0.5 and 4 Kbits.

Finally, the test application may be adapted to notify a test operator about the outcome of the scan test of the semiconductor circuit by writing a suitable pass or fail message to a display or printing device.

BRIEF DESCRIPTION OF THE DRAWINGS

Embodiments of the invention will be described in further detail in connection with the append drawings in which.

DESCRIPTION OF PREFERRED EMBODIMENTS

Figure 1:
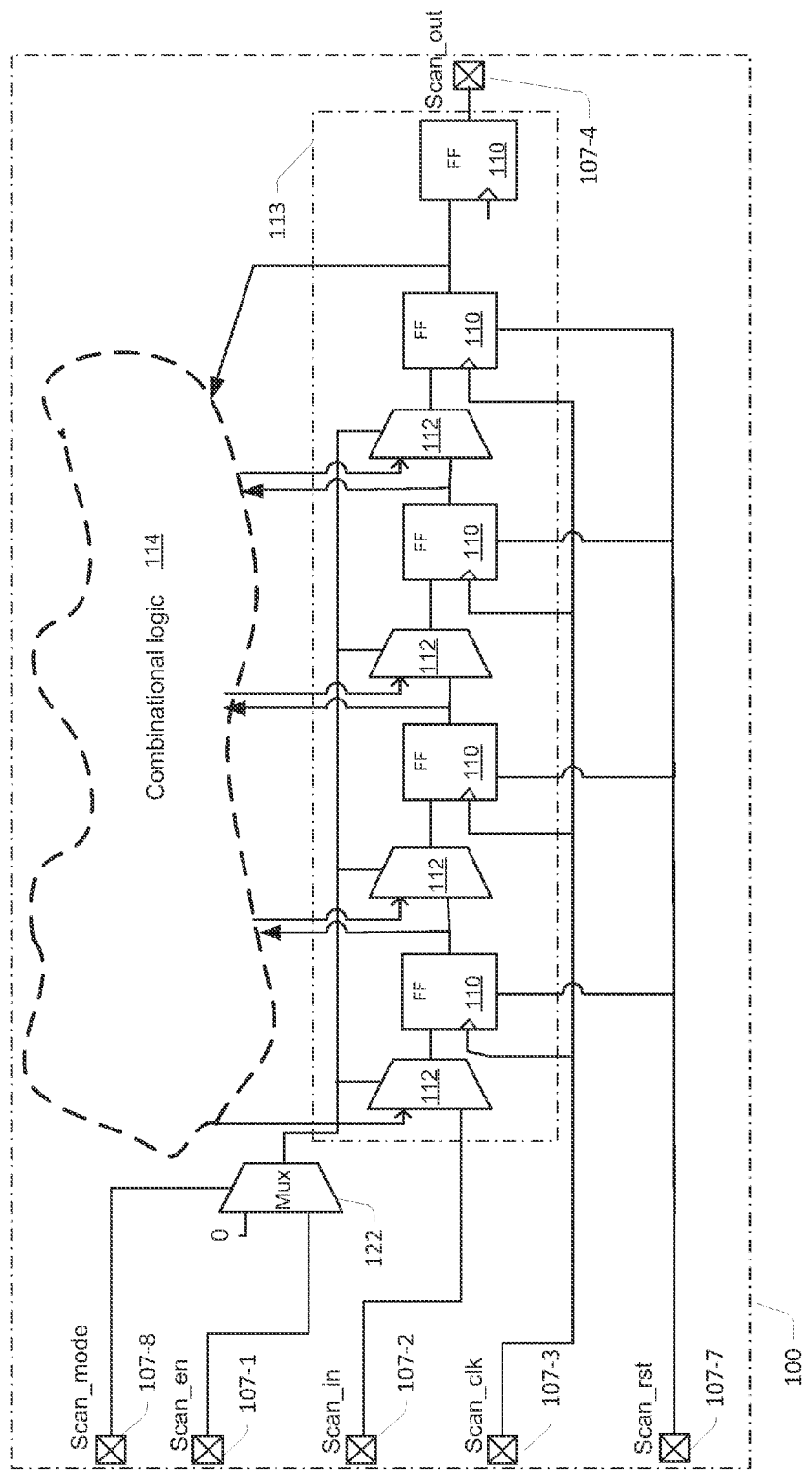
FIG. 1 is a schematic diagram of a prior art semiconductor device with associated scan test logic and scan pins.

FIG. 1 is a schematic diagram of a prior art semiconductor device 100 with associated scan test logic and externally accessible scan input and output pads or pins 107-1, 107-2, 107-3, 107-4, 107-7, 107-8. The semiconductor device 100 comprises a digital circuit portion which comprises a combinatorial logic block 114. The combinatorial logic block 114 is coupled to a scan chain 113 which schematically comprises 4 cascaded stages of flip-flops 210 and 4 cascaded multiplexers 212 inserted between outputs and data inputs of the cascaded flip-flops 110. In practice, the scan chain 113 may comprise a much higher or larger number of cascaded stages of flip-flops 110 and multiplexers 112. The scan chain 113 functions like a shift register when the scan mode of the semiconductor circuit 100 is enabled through the external pad 107-8 Scan_mode which is coupled to select inputs of each of the 4 cascaded multiplexers 112 through a scan enable multiplexer 122. In the scan enabled mode, a predefined digital test pattern can be sequentially loaded or clocked into the scan chain 113 via an external pad 107-2 Scan_in in conjunction with toggling a scan clock signal via the external pad 107-3 Scan_clk. Hence, the outputs of the 4 cascaded stages of flip-flops 110, which hold the predefined digital test pattern, can be applied to respective inputs of the combinatorial logic block 114 once the scan chain 113 is full as illustrated by the wires with arrows pointing towards logic block 114. An external pad 107-4 Scan_out is arranged at an output of the scan chain 113 where output bits of a digital response pattern are sequentially outputted in response to the application of the predefined digital test pattern.

An external pad 107-7 Scan_rst is coupled to respective reset inputs of the cascaded flip-flops 210. During scan testing of the semiconductor device ordinary ATPG test equipment and software is used for accessing or probing the scan chain 113 via the externally accessible scan input and output pads 107-1, 107-2, 107-3, 107-4, 107-7, 107-8. The ATPG test equipment writes sequentially each of the predetermined digital test patterns into the scan chain 113, toggles the scan clock signal, applies each predetermined digital test pattern to the combinatorial logic block 114 and finally reads out the digital response pattern via external pad 107-4. The test software running on the ATPG test equipment makes a comparison between the digital response pattern and a corresponding reference or expect bit pattern to determine whether the combinatorial logic block 114 passed or failed the scan test. While the externally accessible scan input and output pads 107-1, 107-2, 107-3, 107-4, 107-7 and 107-8 allow rapid manufacturing test of the semiconductor device 100 in a semiconductor production environment where the semiconductor device 100 is unconnected to any other electronic circuitry, these external pads are allocated for other I/O functions once the semiconductor device 100 has been mounted on a customer's circuit board/PCB. Hence, the scan input and output pads 107-1, 107-2, 107-3, 107-4, 107-7 and 107-8 which possess the ATPG functionality become electrically coupled to surrounding board circuitry which eliminates any possibility of controlling logic states and voltages on these external pads for the purpose of accessing and manipulating the scan chain 113 when the semiconductor device 100 is in-system mounted on the customer's circuit board/PCB.

Figure 2:
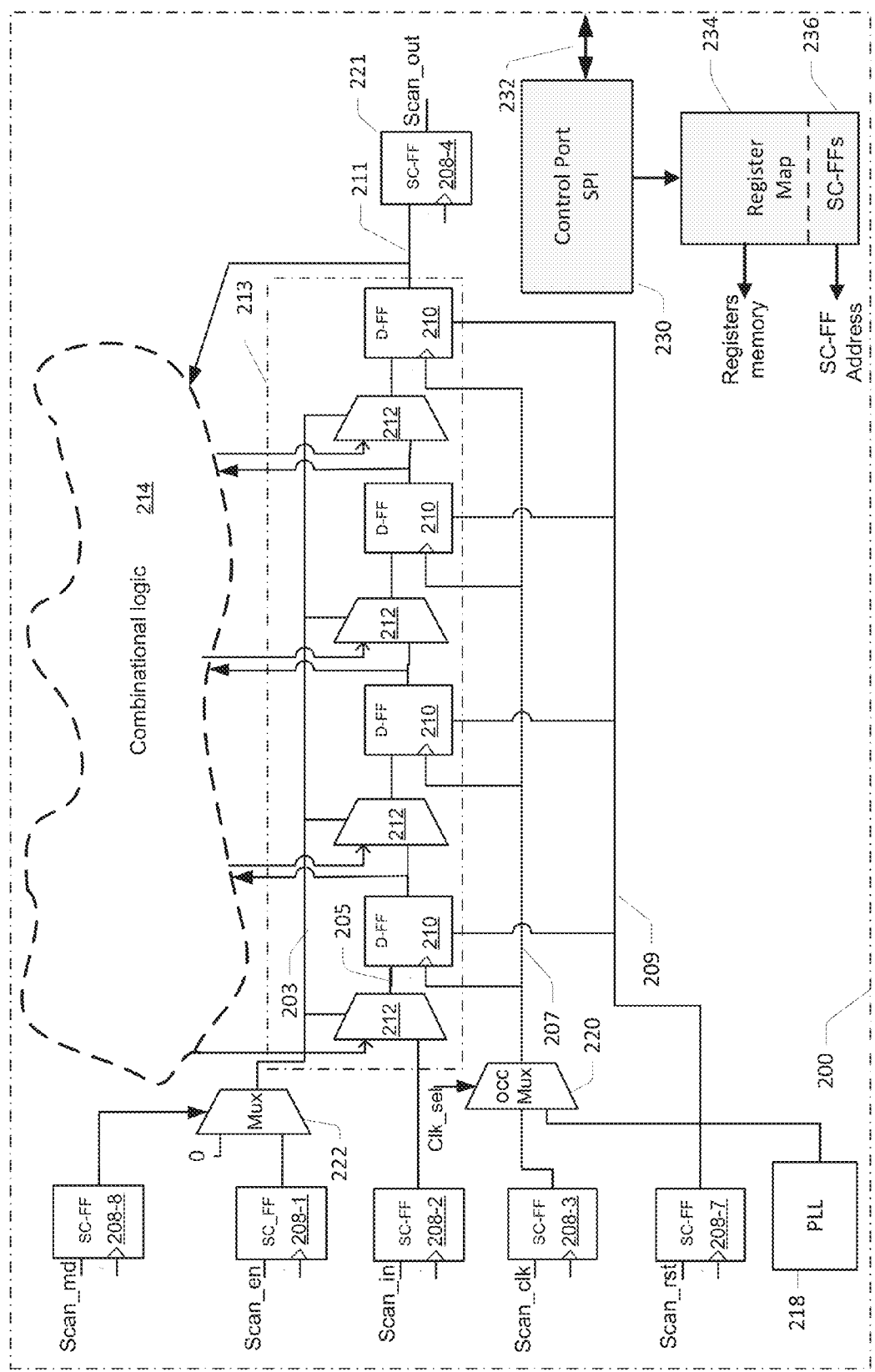
FIG. 2 is a schematic diagram of a semiconductor device comprising scan control hardware for in-system scan testing according to a preferred embodiment of the invention.

FIG. 2 is a schematic diagram of a semiconductor device 200 comprising on-chip scan control hardware allowing in-system scan testing of digital logic according to a preferred embodiment of the present invention. The semiconductor device 200 may comprise exclusively digital logic for example including combinational digital logic and sequential digital logic. In the alternative, the semiconductor device 200 may comprise both digital logic and analog circuitry in a so-called mixed-signal design. The analog circuitry may comprise a plurality of programmable parameters of analog functions such as frequency selective filters, preamplifiers and class D output amplifiers etc. implemented by respective analog circuit blocks. The semiconductor device 200 may comprise a CMOS or BiCMOS chip or die fabricated in sub-micron technology.

The semiconductor device 200 comprises a digital circuit portion which comprises at least one combinatorial logic block 214. The combinatorial logic block 214 is coupled to a scan chain 213 which comprises 4 cascaded stages of flip-flops 210 with 4 interposed multiplexers 212 inserted between data outputs and data inputs of the cascade of flip-flops 210. The skilled person will understand that in practice, the scan chain 213 preferably comprises a much higher or larger number of cascaded stages of flip-flops 210 and associated multiplexers 212 such as between 24 and 1024 cascaded stages. The scan chain 213 functions like a shift register when a first scan interface node 203, which is coupled to respective select inputs of the cascaded multiplexers 212, is asserted and a scan enabled mode of the scan chain 213 becomes enabled. In the scan enable mode, a predefined digital test pattern can be sequentially loaded into the scan chain via a second scan control flip-flop 208-2, Scan_in, as described in additional detail below. Hence, the data outputs of the 4 cascaded stages of flip-flops 210 can be applied to respective inputs of the combinatorial logic block 214 once the scan chain 213 is full as illustrated by the wires with arrows pointing towards the block 214. A third scan interface node 207 is coupled to respective clock inputs of the 4 cascaded flip-flops 212 of the scan chain 213 for clocking the scan chain by a common scan clock signal. A fourth scan interface node 211 is arranged at an output of the scan chain 213 where output bits of a digital response pattern is sequentially outputted from outputs of the combinatorial logic block 214 in response to the predefined digital test pattern.

The semiconductor device 200 further comprises a bi-directional communication port 230 which may comprise an industry standard serial data interface such as I$^2$C data communication interface, a SPI data communication interface or a JTAG data communication interface etc. The bi-directional communication port 230 can be used by external devices with a corresponding communication interface to transmit various types of data to the semiconductor device 200 and/or read stored data from the semiconductor device 200. The incoming data may be written to, or read from, a designated address space of the digital circuit portion of the semiconductor device 200 for example register and/or memory addresses. The memory addresses may be situated in RAM memory or non-volatile memory such as EEPROM or flash memory of the digital circuit portion of the semiconductor device 200. A first portion 234 of a register map of the bi-directional communication port 230 is utilized to access the designated address space on the digital portion by a register/memory read or write command issued through the bi-directional communication port 230. In this manner incoming data can be written to the designated address space and stored data of the designated address space can be read out through the bi-directional communication port 230.

The register map comprises a second portion 236 which is utilized to access a plurality of individually addressable scan control flip-flops 208-1, 208-2, 208-3, 208-4, 208-7 and 208-8 of the scan control hardware through the bi-directional communication port 230. Bit values or logic states can selectively be read from, or written to, each of the individually addressable scan control flip-flops through the bi-directional communication port 230 by utilizing the second portion 236 of the register map. Since these individually addressable scan control flip-flops 208-1, 208-2, 208-3, 208-4, 208-7 and 208-8 are operatively coupled to respective inputs and outputs of the scan chain 213, it is possible to transmit digital test patterns, read digital response patterns and generally manipulate the operation of the scan chain 213 through the bi-directional communication port 230. These functions can be achieved from the external source or microprocessor which leads to numerous benefits as explained below in additional detail.

The first individually addressable scan control flip-flop 208-1 has a data output coupled to the above-mentioned first scan interface node 203 through an intermediate scan mode multiplexer 222 such that the scan chain 213 can be selectively enabled and disabled through the first scan control flip-flop 208-1 when the intermediate scan mode multiplexer 222 is set to convey the data output of the first scan control flip-flop 208-1 to the first scan interface node 203. Furthermore, since the input, at Scan-in, of the first scan control flip-flop 208-1 can be addressed and written through the bi-directional communication port 230 it is possible to enable or disable the scan chain by writing the appropriate logic state to the input of the first scan control flip-flop 208-1. The second individually addressable scan control flip-flop 208-2 has a data output coupled to the above-mentioned second scan interface node 205 for receipt of the predefined digital test pattern. The predefined digital test pattern is loaded into the scan chain 213 by sequentially addressing the second scan control flip flop 208-2 and writing individual bit values of the predefined digital test pattern to the input, Scan_in, of the second scan control flip flop 208-2. Between the writing of successive bit values of the predefined digital test pattern to the input of the second scan control flip flop 208-2, the third individually addressable scan control flip-flop 208-3 is addressed two consecutive times through the bi-directional communication port 230 by appropriate commands so as to toggle the scan clock signal and sequentially shift the bit values of the predefined digital test pattern through the cascaded stages of flip-flops 210. The third scan control flip-flop 208-3 has its data output coupled to an optional clock select multiplexer 220 that is controlled by a clock select input as explained below in further detail below.

The seventh scan control flip-flop 208-7 has an output coupled to a seventh interface node 209 of the scan chain 213. The seventh interface node 209 is coupled to reset inputs of the cascaded flip-flops 210 of the scan chain 209 allowing the cascaded flip-flops 210 to be reset by the seventh scan control flip-flop 208-7 by addressing and writing appropriate logic states to the input, Scan-rst, thereof through the bi-directional communication port 230. Preferably, the seventh interface node 209 is toggled one time before the predefined test pattern is loaded into the scan chain 213 to set the scan chain in a known state.

A fourth individually addressable scan control flip-flop 208-4 has an input coupled to a data output of the scan chain 213 at the last flip-flop 210 of the cascade of flip-flops. The data output of the fourth scan control flip flop 208-4, Scan_out, accordingly temporarily stores the individual bit values of the digital response pattern which are shifted out of the scan chain 213 simultaneously with the sequential loading of predefined digital test patterns. The individual bits values of the digital response pattern are sequentially read from the bi-directional communication port 230 by addressing and reading the output of the fourth scan control flip flop 208-4.

The dynamic operation of the scan control hardware and the scan chain 213 during scan testing of the combinatorial logic block 214 preferably proceeds as follows: The individually addressable scan control flip-flop 208-8 is addressed and enabled or asserted from the bi-directional communication port 230 through the intermediate scan mode multiplexer 222 to place the semiconductor circuit 200 in the scan mode. This step allows the first scan control flip-flop 208-1 to take control over the scan chain enablement/disablement as explained above through the scan mode multiplexer 222. Thereby, the semiconductor circuit 200 is placed in the scan chain enabled state by addressing and asserting the scan enabled state controlled by the first scan control flip-flop 208-1 from the bi-directional communication port 230 by an appropriate write command. Thereafter, the second scan control flip-flop 208-2, which has the data output coupled to the second interface node 205 of the scan chain 213, is addressed by a suitable command from the bi-directional communication port 230 to write a first bit value of the first digital test pattern to the input of the second scan control flip-flop 208-2. The test methodology proceeds by addressing the fourth scan control flip-flop 208-4 coupled to the output of the scan chain 213 from the bi-directional communication port 230 and temporarily storing the bit value of the digital response pattern held at the output, Scan_out, of the fourth scan control flip-flop 208-4. During the initial loading of the first digital test pattern in the test procedure, the output bit values at Scan_out are don't cares because they do not represent the desired bit values of the digital response pattern before the combinational block has been actuated by the first digital test pattern. The scan clock signal on interface node 207 is subsequently toggled (i.e. one rising and one falling clock edge) by addressing and writing appropriate logic states to the third scan control flip-flop 208-3 from the bi-directional communication port 230. The toggling of the clock input to the scan chain 213 shifts bit values held at the inputs of the cascade of scan flip-flops 210 one step forward such that a new bit value of the digital test pattern is shifted into the scan chain 213 and the bit value held in the last flip-flop 210 of the scan chain 213 is written to the input of the fourth scan control flip-flop 208-4.

The above actions of sequentially writing bit values of the first digital test pattern, storing output bit values and toggling the scan clock signal is repeated a predetermined number of times, N, to sequentially shift the bit values written to the second scan control flip-flop 208-2 into the scan chain 213 until the entire first digital test pattern has been loaded. N is a positive integer that corresponds to the number of bits of the predefined digital test patterns to be applied. Thereafter, the combinational logic 214 is placed in the functional mode by addressing and writing to the first scan control flip-flop 208-1 to deactivate or disable the scan enable state of the scan chain 213 from the bi-directional communication port 230. By deactivating the scan enable state, each of the cascaded multiplexers 212 is adapted to transmit or convey outputs of the combinatorial logic block 214 coupled to the upper inputs of the multiplexers 212 to the input of the associated scan chain flip-flop 210. The scan clock signal is thereafter toggled a single time through the third scan control flip-flop 208-3 such that the first digital test pattern is applied to the inputs of the combinatorial logic block 214, the combinatorial logic block stimulated for one clock cycle and the first digital response pattern produced in response thereto. The first digital response pattern is written to the scan chain 213 through the cascaded scan multiplexers 212 as explained above. The scan chain 213 is thereafter again placed in the scan enabled state by addressing and asserting the logic state, e.g. setting a logic high state, of the first scan control flip-flop 208-1 from the bi-directional communication port 230. The scan chain 213 is now ready for outputting the first digital response pattern generated in response to the application of the first digital test pattern and stored in the scan chain 213. The first digital response pattern is now sequentially shifted out of the scan chain 213 by repeating the above-mentioned steps or actions of sequentially writing bit values of the digital test pattern, storing output bit values and toggling the scan clock signal, but this time in respect of a second digital test pattern. In this manner, the second digital test pattern is read into the scan chain 213 at the same time as the first digital response pattern is shifted out of the scan chain and individual bit values temporarily stored the at the output of the fourth scan control flip-flop 208-4. This entire process of shifting new digital test patterns into the scan chain 213, toggling the scan clock signal and sequentially shifting out bit values of the generated digital response pattern may be repeated a predetermined number of times, M, corresponding to the number of individual digital test patterns. The value of M is chosen by the test designer to reach a desired struck-at fault coverage of the combinatorial logic block 214.

The scan testing of the combinatorial logic block 214 through the scan control hardware may proceed in at least two distinct manners to check the validity or correctness of each of the generated digital response pattern(s). According to a preferred embodiment, the test methodology comprises a step of sequentially reading the bit values of the digital response pattern which are temporarily stored at the output of the fourth scan control flip-flop 208-4. This is preferably carried out by addressing and reading the output of the fourth scan control flip-flop 208-4 from the bi-directional communication port 230 each time a new bit value of the digital response pattern is shifted out of the scan chain 213 and a new bit value of the next digital test pattern is simultaneously shifted into the scan chain 213. This could be viewed as a diagnostics mode type of test because individual failed bits of the digital response pattern can be identified by comparison with a predetermined expect or reference bit pattern. In another preferred embodiment, the validity or correctness of each of the generated digital response pattern(s) is checked on-chip against the predetermined expect or reference bit pattern by dedicated logic circuitry included in the scan control hardware. This embodiment of the invention is explained in further detail below in connection with FIG. 4.

In the present embodiment of the semiconductor circuit 200, each of the digital response patterns are read by sequentially addressing and reading the output of the fourth scan control flip-flop 208-4 from the bi-directional communication port 230. As mentioned above, the external microprocessor comprises a test program which comprises a set of pre-stored executable program instructions that issues appropriate read commands through the bi-directional communication port 230 in accordance with the communication protocol of the communication port. The connection between the external microprocessor 503 and the semiconductor circuit 200 on a common circuit board 500 is schematically illustrated on FIG. 5. When the external microprocessor 503 has read a complete digital response pattern, comprising N bits, the test program compares bit values of the digital response pattern with corresponding bit values of a predetermined expect or reference bit pattern. The predetermined expect or reference bit pattern is simply the response pattern of a 'known good machine' or correctly functioning digital logic block. If these patterns are identical, the test program proceeds by checking the validity of the next digital response pattern until all digital test patterns have been checked and approved. A positive result of the scan test procedure is thereafter communicated from the external microprocessor to the test operator in a suitable manner for a particular test system for example by transmitting an OK/Pass message to a display or screen of the test system. If the result of the test procedure on the other hand turns out negative because one or more of the digital response patterns failed to comply with the corresponding predetermined expect bit pattern, the failing digital test pattern and the failing bits of the response pattern are preferably recorded by the test system. The test system and test operator can use the collected failure data to diagnose the digital circuit portion of the semiconductor circuit 200 under test to identify, and possibly redesign, particularly critical or error-prone portions of logic of the semiconductor circuit 200 such as logic portions that consistently show a high failure rate on many semiconductor circuits 200.

The skilled person will appreciate that while the schematic diagram of FIG. 2 only depicts a single combinatorial logic block 214, and a single associated scan chain 213 with accompanying scan control hardware, the digital circuit portion of the semiconductor circuit 200 may comprise a plurality of additional combinatorial logic blocks such as between 2 and 20 logic blocks that each is coupled to a dedicated scan chain and scan control hardware in a corresponding manner. Each of these additional combinatorial logic blocks preferably comprises separate individually addressable scan control registers for loading the digital test pattern and outputting the digital response pattern. The output of the first scan control flip-flop 208-1, for enabling and disabling the scan state, and the output of the third scan control flip-flop 208-3, for supplying the scan clock signal to the scan chain 213, are preferably shared between the plurality of additional combinatorial logic blocks. Each of these additional combinatorial logic blocks may be sequentially tested as described above in connection with a test of all logic circuitry, in particular all core logic circuitry, of the entire semiconductor circuit 200.

The semiconductor circuit 200 also comprises a clock multiplier 218 comprising a PLL that multiplies an incoming clock signal with a certain integer or non-integer factor to provide a multiplied clock signal with a higher frequency than the incoming clock signal. The incoming clock signal may be generated by an external crystal based clock generator, similar to the clock generator used in the assembled circuit board, through an externally accessible pad or terminal of the semiconductor circuit 200. The output of the optional clock select multiplexer 220 transmits either the clock signal from the scan control flip-flop 208-3 or the multiplied clock signal generated by the PLL 218 in accordance with the clock select signal, Clk_sel. The purpose of the PLL 218 and the multiplied clock signal is to allow the combinatorial logic block 214 to be tested at full operational speed i.e. to perform an at so-called 'transition at-speed' test and validation of the combinatorial logic block 214. This is an optional but highly useful feature of the present embodiment of the semiconductor circuit 200. The maximum frequency at which the clock signal conveyed through the scan control flip-flop 208-3 can be toggled is often limited by the speed of the bi-directional communication port 230 because each clock signal toggling requires several consecutive write commands addressing the scan control flip-flop 208-3 to be performed. Popular types of standardized bi-directional communication port interfaces are often speed limited at about 20-30 MHz which may be far below the nominal or specified operational speed of the digital logic of semiconductor circuit 200.

Figure 3:
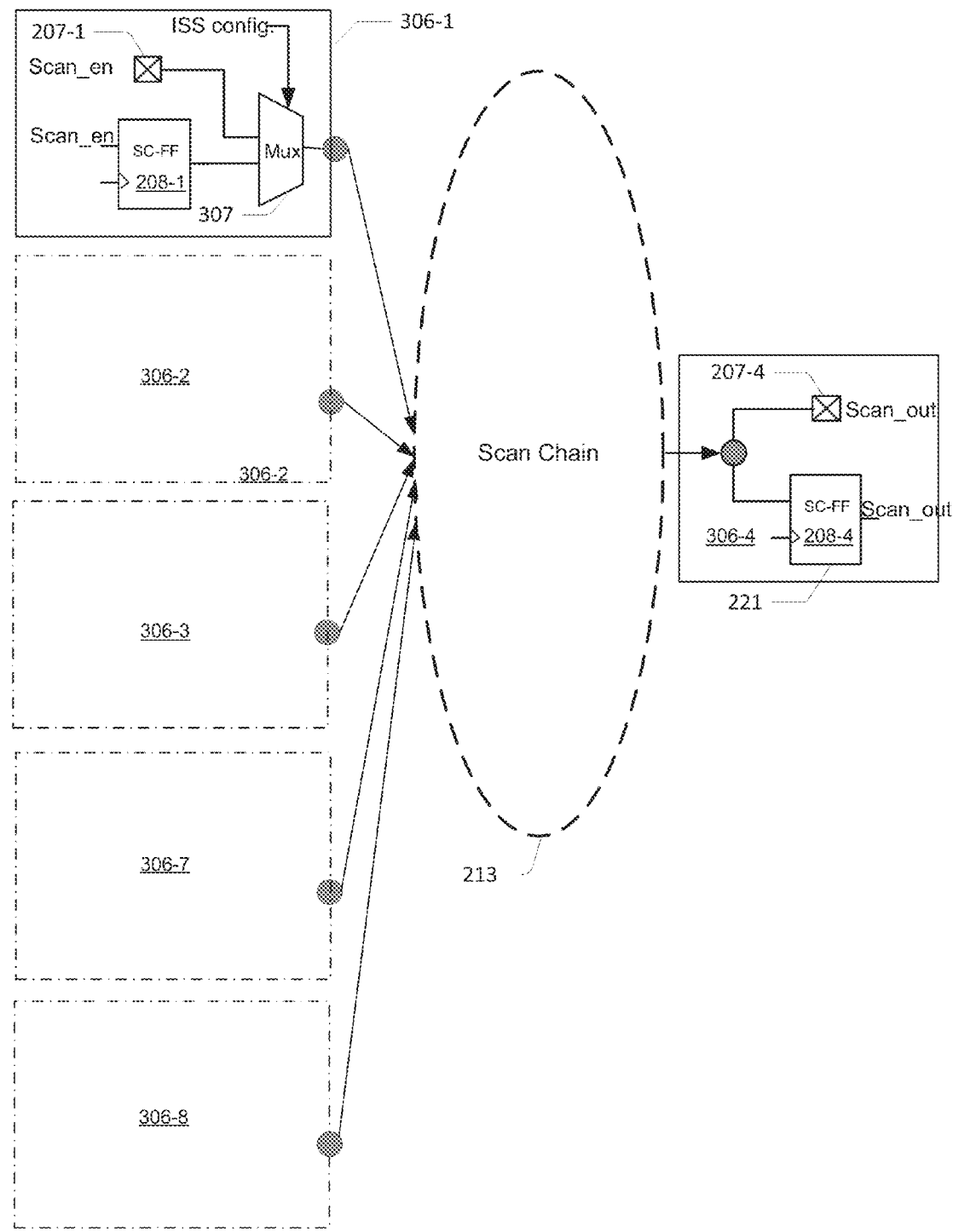
FIG. 3 is a schematic illustration of input and output circuitry of a series of scan control flip-flops in accordance with the preferred embodiment of the invention.

FIG. 3 is a schematic illustration of preferred input and output circuitry associated with the plurality of individually addressable scan control flip-flops 208-1, 208-2, 208-3, 208-4, 208-7 and 208-8 of the scan control hardware described above. While, in-system scan testing of the digital circuit portion of the semiconductor circuit 200 is possible exclusively through the individually addressable scan control flip-flops 208-1, 208-2, 208-3, 208-4, 208-7 and 208-8, the present input and output circuitry provides an additional option for performing scan testing via externally accessible input and output pads. The scan testing via externally accessible input and output pads makes the semiconductor device 200 compatible with the ordinary scan test equipment and software used for production testing of digital semiconductor devices. The ordinary scan test equipment typically allows the scan testing of the semiconductor device 200 to be performed faster compared to the in-system methodology described above using the scan control hardware in combination with the bi-directional control port 230. The present embodiment therefore supports ordinary ATPG scan testing of the semiconductor circuit 200 while retaining the numerous advantages associated with the in-system scan testing capability provided by this previously described scan control hardware.

The input circuitry depicted in the upper box 306-1 comprises an externally accessible input pad 207-1 that is coupled in parallel with the scan control flip-flop 208-1 to respective inputs of the two-input multiplexer 308. The two-input multiplexer 308 transmits either the output of the scan control flip-flops 208-1 or a logic signal, Scan_en to the output such that the scan enable clock interface node (203 on FIG. 2) is driven through either the externally accessible input pad 207-1 or the scan control flip-flop 208-1 in accordance with the state of the select signal ISS config. The input circuitry depicted in upper box 306-1 is replicated inside the dotted boxes 306-2 to 306-8 as schematically indicated depicted such that each box comprises a corresponding externally accessible input pad and a multiplexer controlled by the state of the select signal ISS config. The output circuitry depicted in box 306-4 comprises an externally accessible pad 207-4 that simply is coupled in parallel with the scan control flip-flop 208-4 from the output of the scan chain 213. Hence, the ordinary ATPG scan test equipment is capable of accessing and reading the digital response patterns via externally accessible pad 207-4 during manufacturing testing.

Figure 4:
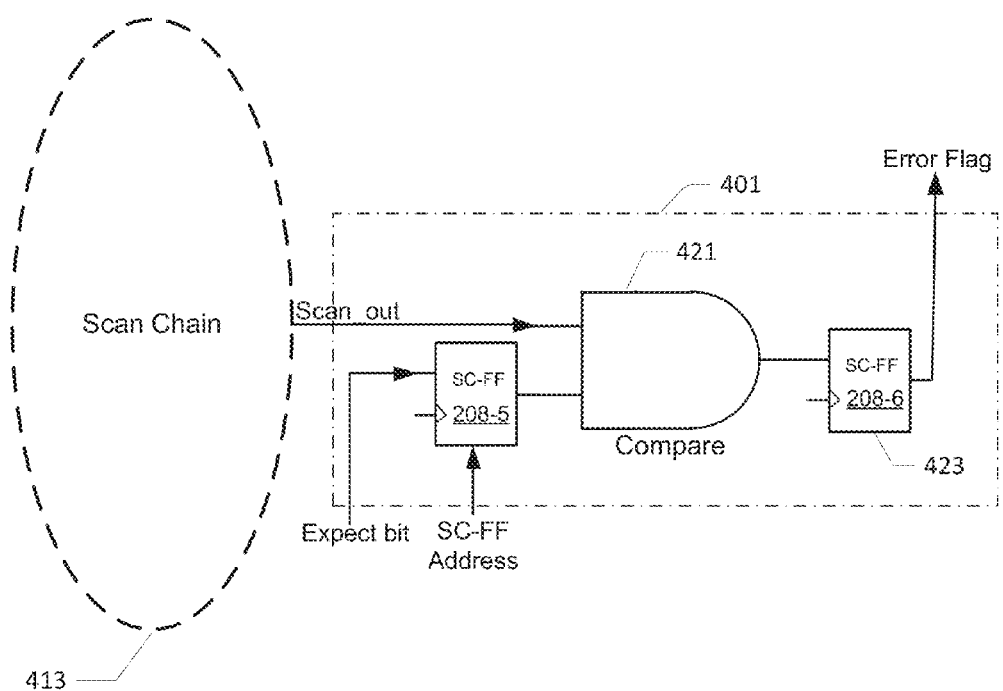
FIG. 4 is a schematic illustration of scan test hardware supporting a simple pass/fail mode evaluation of a combinatorial logic block in accordance with a second embodiment of the invention.

FIG. 4 is a schematic illustration of additional scan test hardware 401 which may be utilized to support a simple pass/fail mode evaluation of the digital logic of the semiconductor circuit 200 in accordance with a second embodiment of the invention. In the present embodiment, the loading of the predetermined digital test pattern to the scan chain, toggling of the scan clock signal and outputting the digital response pattern proceeds as described above in connection with FIG. 2. However, the additional scan test hardware 401 supports an alternative test procedure where the control of the validity of the generated digital response pattern is checked on-chip, i.e. by the scan control hardware of the semiconductor circuit itself, by a comparison against the predetermined expect bit pattern. The additional scan test hardware 401 comprises a data comparator circuit in form of two-input AND-gate 421 which has one input connected to the output of the fourth scan control flip flop 208-4, Scan_out, at the output of the scan chain 413 where the individual bit values of the digital response pattern are sequentially shifted out. The other input of the two-input AND-gate 421 is connected to a fifth individually addressable scan control flip-flop 208-5 which is configured for receipt and temporary storage of bit values of the predetermined expect bit pattern transmitted from the bi-directional communication port 230. When the bit value of the digital response pattern and the corresponding bit value of the predetermined expect bit pattern are applied to the respective inputs of the two-input AND-gate 421, a capture command is transmitted to the AND-gate such that the logic function is evaluated and a binary result generated at the output of the AND-gate 421. The binary result of the comparison is subsequently stored in a sticky error register built around a sixth individually addressable scan control flip-flop 208-6. The sticky error register is configured to assert an error flag at a first detection of a pattern error during the above-mentioned data comparison between corresponding bit values of the digital response pattern and the predetermined expect bit pattern. The asserted state of the error flag is retained throughout residual bit comparisons between the expect bit pattern and the digital response pattern for each of the predefined digital test patterns. In this manner, a data error is flagged by the sticky error register if just a single bit of the digital response pattern is incorrect. The external microprocessor (item 503 on FIG. 5) is preferably adapted to reading the state of the error flag through the bi-directional communication port 230 once all digital response patterns have been checked against the respective predetermined expect bit patterns. Consequently, the stick error flag produces a pass or fail indication of the entire test procedure covering all the predefined digital test patterns such that the test result can be evaluated by issuing a single read command from the external microprocessor through the bi-directional communication port 230.

This simple pass/fail mode evaluation of the digital logic of the semiconductor circuit 200 can be applied while the latter remains mounted on the customer's circuit board as described in connection with FIG. 5 below.

Figure 5:
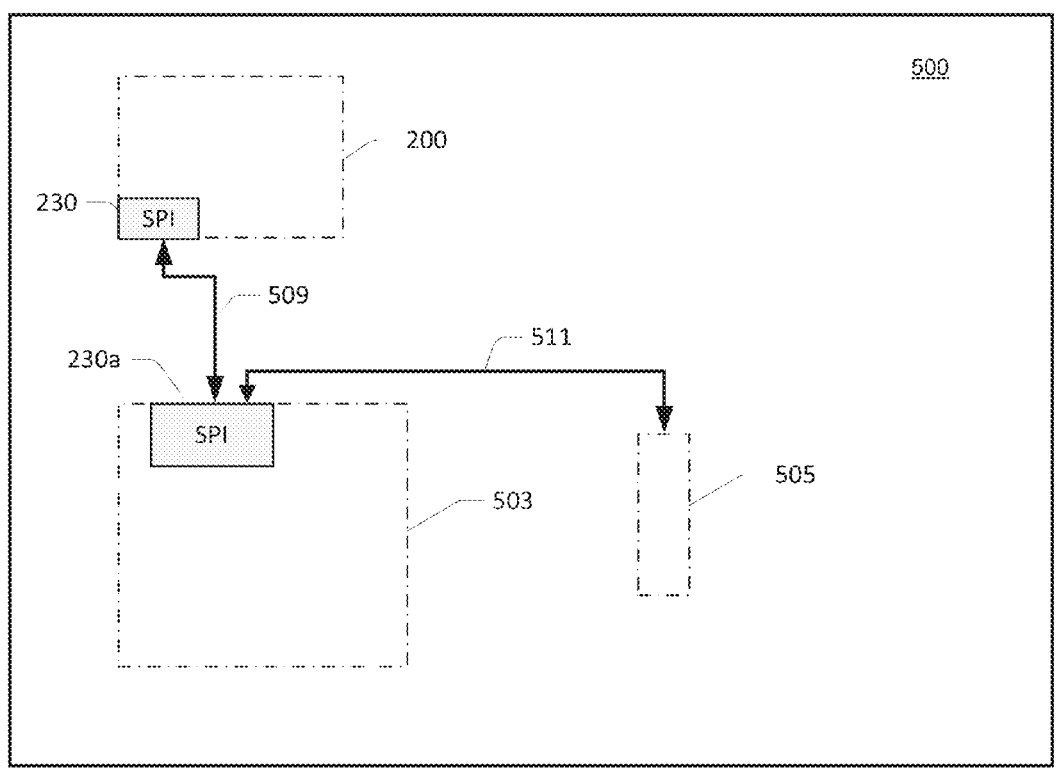
FIG. 5 is a schematic illustration electronic circuit board assembly comprising a semiconductor device and a programmable microprocessor interconnected via a common data bus and serial communication interface.

FIG. 5 is a schematic illustration electronic circuit board assembly comprising the above semiconductor device 200 and the external programmable microprocessor 503 interconnected via a common data bus 509 on the circuit board 500. Each of the semiconductor device 200 and the external programmable microprocessor 503 comprises a control port 230, 230a, preferably implemented as an industry standard type of wired bi-directional serial data communication interface, such as SPI, allowing the exchange of data through the common data bus 509. The printed circuit board 500 may be the customer's printed circuit board holding the semiconductor device 200 and a plurality of additional electronic components to form a complete electronic module for automotive applications. In the present exemplary embodiment, a non-volatile memory device 505 such as EEPROM and/or flash memory is mounted on the printed circuit board 500 and coupled to the external programmable microprocessor 503 or microprocessor through a dedicated serial data interface 511. The EEPROM and/or flash memory may in the alternative be integrated together with the microprocessor 503 on a single semiconductor die. The microprocessor 503 is accordingly able to write data to the non-volatile memory device 505 and read data therefrom by issuing appropriate commands or instructions through the dedicated serial data interface 511. The non-volatile memory 505 stores a set of executable microprocessor instructions or commands that collectively form a test program for implementing the above described methodology for in-system scan testing of the semiconductor device 200 utilizing the simple pass/fail mode evaluation. Consequently, the test program comprises commands for addressing, writing and reading the scan control hardware, in particular the individually addressable scan control flip-flops 208-1, 208-2, 208-3, 208-4, 208-5, 208-6, 208-7 and 208-8 as described above. The test program also comprises the predefined digital test patterns and the corresponding expect bit patterns that are sequentially written to the semiconductor device 200 during scan testing as described above.

Consequently, the manufacturer of the printed circuit board 500 is capable of running a comprehensive scan test of the semiconductor device 200 while mounted to the printed circuit board 500 under control of the test program stored in the non-volatile memory device 505 by exploiting the on-chip scan chain hardware. This feature allows the customer to test a failing semiconductor device 200, or suspected failing device, at his factory premises and thereby detect and eliminate "early life failures" of the semiconductor device 200 before shipment or field application.

Furthermore, the manufacturer of the semiconductor device 200 is capable of testing returned semiconductor devices while these remains mounted in the customer's circuit board. This feature eliminates the previously described time-consuming and risky process of removing/de-soldering the semiconductor device 200 from the circuit board 500.

Thanks to the flexibility of the scan control hardware the returned semiconductor device can be subjected to the more rigorous diagnostic mode test procedure described above where the test operator can exploit information about individually failed bit(s) of the digit response pattern(s) to identify, and possibly redesign, particularly critical portions of logic of the semiconductor circuit 200 such as logic blocks or devices that consistently show a high failure rate.

The invention claimed is:

1. A semiconductor circuit comprising:
    a digital circuit portion comprising a combinatorial logic block;
    a scan chain configured to load and apply a predefined digital test pattern to inputs of the combinatorial logic block, the scan chain being further configured to read and transmit a digital response pattern produced by outputs of the combinatorial logic block in response to the predefined digital test pattern;
    a bi-directional communication port for writing incoming data to an address space of the digital circuit portion, the address space including addresses of a plurality of individually addressable scan control registers; and
    scan control hardware configured to selectively place the semiconductor circuit in one of a scan mode and an operational mode, the scan control hardware including the scan control registers, which are configured to, in response to input sent through the bi-directional communication port by a test equipment external to the semiconductor circuit: (i) selectively enable and disable the scan chain during the scan mode, (ii) receive the predefined digital test pattern from the bi-directional communication port, (iii) pass the predefined digital test pattern to the scan chain, and (iv) output the digital response pattern through the bi-directional communication port.

2. The semiconductor circuit according to claim 1, wherein the scan control hardware comprises:
    a set of externally accessible scan input pads; and
    a set of scan select multiplexers that couple the scan chain to outputs of the first, second and third scan control registers such that:
        first inputs of the scan select multiplexers are coupled to outputs of respective ones of the scan control registers; and
        second inputs of the scan select multiplexers are coupled to respective ones of the set of externally accessible scan input pads;
    wherein each scan select multiplexer is controlled by a scan configuration signal provided by an individually addressable scan control register such that the scan chain is selectively drivable from one of the set of externally accessible scan input pads and the set of scan control registers.

3. The semiconductor circuit according to claim 1, wherein the scan control hardware comprises:
    a clock multiplier having a clock input coupled to a system clock signal of the semiconductor circuit and configured to produce a multiplied clock signal with a higher frequency than the system clock signal; and
    a clock multiplexer coupled to the output of one of the scan control registers and to the multiplied clock signal to selectively transmit, to the scan chain, one of the output of the one scan control register and the multiplied clock signal.

4. The semiconductor circuit according to claim 1, wherein the bi-directional communication port comprises at least one of an $I^2C$ data communication interface, a SPI data communication interface, and a JTAG data communication interface.

5. The semiconductor circuit according to claim 1, wherein each of the scan control registers is a flip-flop.

6. A method of testing a digital circuit portion of a semiconductor circuit through a scan chain, comprising steps of:
    performing the following by sending input through a bi-directional communication port to a plurality of individually addressable scan control registers located in the semiconductor circuit, wherein the input is sent from a test equipment external to the semiconductor circuit:
    placing the semiconductor circuit in a scan mode;
    selectively enabling and disabling the scan chain during the scan mode;
    sending a predefined digital test pattern to a first one of the scan control registers through the bi-directional communication port, one bit at a time;
    passing the predefined digital test pattern from the first scan control register to the scan chain; and
    receiving a digital response pattern through the bi-directional communication port, wherein the digital response pattern is produced by a combinatorial logic block in response to the predefined digital test pattern being applied to the combinatorial logic block by the scan chain.

7. The method of testing a digital circuit portion of a semiconductor circuit according to claim 6, comprising further steps of:
    sequentially reading bit values of the digital response pattern from the bi-directional communication port by addressing and reading the output of a second one of the scan control registers; and
    comparing read bit values of the digital response pattern with corresponding bit values of a predetermined expect bit pattern.

8. The method of testing a digital circuit portion of a semiconductor circuit according to claim 6, comprising further steps of:
    addressing and writing a bit value of a predetermined expect bit pattern to a third one of the scan control registers, through the bi-directional communication port;
    storing a bit value of the digital response pattern at a fourth one of the scan control registers;
    applying the stored bit value of the digital response pattern and a corresponding bit value of a predetermined expect bit pattern to first and second inputs, respectively, of a data comparator circuit in the semiconductor circuit; and
    comparing the first and second inputs of the data comparator circuit and indicating a result by setting a logic state of a fifth one of the scan control registers.

9. The method of testing a digital circuit portion of a semiconductor circuit according to claim 8, comprising further steps of:
    asserting an error flag when the result of the comparing indicates a pattern error; and
    retaining the asserted state of the error flag throughout residual bit comparisons between the expect bit pattern and the digital response pattern.

10. The method of testing a digital circuit portion of a semiconductor circuit according to claim 9, comprising a further step of:
    reading the state of the error flag from an external microprocessor through the bi-directional communication port to determine whether the digital response pattern matched the predetermined expect bit pattern.

11. The method of testing a digital circuit portion of a semiconductor circuit according to claim 6, comprising further steps of:
sending at least one additional predefined test pattern through the bi-directional communication port to the first one of the scan control registers;
passing each additional predefined test pattern from the first scan control register to the scan chain; and
receiving at least one additional digital response pattern produced by the combinatorial logic block in response to application of the at least one additional predefined test pattern.

12. The method of testing a digital circuit portion of a semiconductor circuit according to claim 7, comprising a further step of:
performing the reading of the bit values of the digital response pattern by transmitting sequential read commands from an external microprocessor through a data communication interface coupled to the bi-directional communication port;
wherein the bit values of the predetermined expect bit pattern are stored in a non-volatile memory operatively coupled the external microprocessor.

13. A method of testing a digital circuit, comprising:
activating a scan mode in response to receiving a control input from a bi-directional communication port;
receiving a test pattern sent through the bi-directional communication port;
sending the test pattern to a scan chain in the digital circuit;
controlling the scan chain, during the scan mode, to test a combinational logic block in the digital circuit by applying the test pattern to the combinational logic block; and
receiving test results from the scan chain and outputting the test results through the bi-directional communication port.

14. The method of claim 13, further comprising:
outputting a digital response pattern included in the test results one bit at a time through the bi-directional communication port.

15. The method of claim 13, further comprising:
selecting the received test pattern using a multiplexer, wherein an alternative test pattern received through a pad that is external to the digital circuit is also selectable, using the multiplexer, as input to the scan chain.

16. The method of claim 13, further comprising:
reading an expect bit pattern through the bi-directional communication port;
comparing the expect bit pattern to a digital response pattern included in the test results;
asserting an error flag bit when the comparing indicates that there is a bit mismatch;
maintaining the asserted error flag bit throughout residual bit comparisons between the expect bit pattern and the digital response pattern; and
outputting the error flag bit through the bi-directional communication port.

17. An apparatus for testing a digital circuit, comprising:
a bi-directional communication port; and
a plurality of scan control registers coupled to the bi-directional communication port, the scan control registers including:
a first scan control register that activates a scan mode in response to receiving a control input from the bi-directional communication port; and
a second scan control register that receives a test pattern sent through the bi-directional communication port and sends the test pattern to a scan chain in the digital circuit;
wherein the scan control registers control the scan chain during the scan mode, such that a combinational logic block in the digital circuit is tested by applying the test pattern to the combinational logic block.

18. The apparatus of claim 17, wherein the scan control registers include a third scan control register that outputs a digital response pattern included in the test results, one bit at a time through the bi-directional communication port.

19. The apparatus of claim 17, further comprising:
a multiplexer that selects between the received test pattern and an alternative test pattern received through a pad that is external to the digital circuit, as input to the scan chain.

20. The apparatus of claim 17, wherein the scan control registers include:
a fourth scan control register that stores an expect bit pattern received through the bi-directional communication port; and
a fifth scan control register that stores an error bit flag, wherein:
the error bit flag is asserted when there is a bit mismatch between the expect bit pattern and the digital response pattern;
the fifth scan control register maintains the asserted error bit flag throughout residual bit comparisons between the expect bit pattern and the digital response pattern; and
the fifth scan control register outputs the error flag bit through the bi-directional communication port.

\* \* \* \* \*